United States Patent [19]

De Jong et al.

[11] Patent Number: 5,233,192
[45] Date of Patent: Aug. 3, 1993

[54] METHOD FOR AUTOTUNING OF AN ELECTRON MICROSCOPE, AND AN ELECTRON MICROSCOPE SUITABLE FOR CARRYING OUT SUCH A METHOD

[75] Inventors: Alan F. De Jong, Eindhoven, Netherlands; Dirk E.M. Vandijck, Aartselaar, Belgium

[73] Assignee: U.S. Philips Corporation, New York, N.Y.

[21] Appl. No.: 821,503

[22] Filed: Jan. 15, 1992

[30] Foreign Application Priority Data

Jan. 17, 1991 [NL] Netherlands ............... 9100076

[51] Int. Cl.$^5$ ............................ H01J 37/26
[52] U.S. Cl. ............................ 250/307; 250/311
[58] Field of Search ............... 250/311, 306, 307

[56] References Cited

U.S. PATENT DOCUMENTS

| | | | |
|---|---|---|---|
| 3,829,691 | 8/1974 | Hufnagel | 250/307 |
| 3,971,936 | 7/1976 | Hoppe | 250/311 |
| 4,514,629 | 4/1985 | Smith et al. | 250/311 |
| 4,894,540 | 1/1990 | Komatsu | 250/310 |
| 4,935,625 | 6/1990 | Hasegawa et al. | 250/311 |
| 5,051,585 | 9/1991 | Koshishiba et al. | 250/311 |
| 5,134,288 | 7/1992 | Van Dijck | 250/311 |
| 5,144,129 | 9/1992 | Kobayashi et al. | 250/311 |

OTHER PUBLICATIONS

Ultramicroscopy vol. 27, 1989, Amsterdam P. 251-273; A. J. Koster et al.

Proc. of the XIITH Int. Cong. For Electron Microscopy 1990, San Francisco pp. 26-27.

Primary Examiner—Bruce C. Anderson
Attorney, Agent, or Firm—Leroy Eason

[57] ABSTRACT

A method of autotuning an electron microscope by producing a series of images of the object to be examined, using a defined tilt of the electron beam in a different direction for each respective image. The images are thereby displaced relative to one another. Each image is then decomposed into a linear and a non-linear component thereof, and the linear image components are separated by Fourier filtering. The relative displacements of a number of the linear image components relative to each other are measured, and the measured displacement values are combined to derive autotuning parameters for the electron microscope.

11 Claims, 1 Drawing Sheet

METHOD FOR AUTOTUNING OF AN ELECTRON MICROSCOPE, AND AN ELECTRON MICROSCOPE SUITABLE FOR CARRYING OUT SUCH A METHOD

BACKGROUND OF THE INVENTION

The invention relates to a method for autotuning of an electron microscope in which a series of images of an object are produced, a defined beam tilt being induced for each of said images in direction which differs for each image, after which a the displacements of the images relative to one another are measured and the displacement information is combined.

The invention also relates to an electron microscope suitable for carrying out the method in accordance with the invention.

A method of this kind is known from the publication "Autotuning of a TEM using minimum electron dose" by A. J. Koster et al in Ultramicroscopy 27 (1989), pp. 251-272. Parameters such as beam tilt, astigmatism and defocus are determined by measurement of displacements of images relative to one another, said parameters being used for controlling the autotuning. It is a drawback of the method disclosed in the cited publication that it is effective only in the case of:

1) low magnifications of the electron microscope
2) high magnifications if the specimens concerned have a transmission function which can be described by means of the "Weak Phase-Object" (WPO) approximation. The WPO approximation deteriorates as the specimen is thicker, and hence does not hold for the vast majority of crystalline TEM specimens.

SUMMARY OF THE INVENTION

It is an object of the invention to provide a method enabling autotuning to be performed also in the case of comparatively thick and/or crystalline specimens with high electron microscope magnifications.

To achieve this, the method in accordance with the invention is characterized in that each image is decomposed into a linear and a non-linear image part, only the linear image part being selected for further processing. An image of an object which is not suitable for the WPO approximation contains linear as well as non-linear image information, the linear image information being understood to mean the part of the image contrast information which is proportional to the wave function produced at the exit plane of the object. Because the Koster method is applicable only to linear signals, selection of the linear image part enables subsequent application of a method analogous to the Koster method.

A special version of the method in accordance with the invention is characterized in that the linear image part is selected by Fourier filtering, that is, a filtering operation in the Fourier space.

A further version of the method in accordance with the invention is characterized in that the number of images include a first image and at least two further images, a measure of unintentional beam tilt being determined from the displacement of the linear image part of the first image relative to a reference. For the determination of defocus and astigmatism it is desirable, but not always necessary, to know the non-intentional beam tilt.

A further version of the method in accordance with the invention is characterized in that the reference is formed by the further images. One way of determining the unintentional beam tilt consists of the measurement and combination of the displacements of the linear image parts of the first image and the further images relative to one another. The further images are to be understood to mean the images with induced beam tilt.

A further version of the method in accordance with the invention is characterized in that each image is one of a series of elementary images with different defocus values, the linear part of each being selected by separation from the non-linear image part in a three-dimensional Fourier space. By producing a number of elementary images with different defocus values, a quasi-three-dimensional image area is recorded. One way of selecting the linear image information present therein consists in separation in the three-dimensional Fourier space.

A further version of the method in accordance with the invention is characterized in that separation is performed by subjecting each elementary image to a two-dimensional Fourier transformation, thus forming a number of spectra which corresponds to the number of elementary images, said spectra being multiplied by a number of complex weighting factors, followed by summing. This is a practical and fast method of realising the separation and selection.

A further version of the method in accordance with the invention is characterized in that the weighting factors take the relevant beam tilt into account. If the unintentional beam tilt has been determined, it can be taken into account together with the induced beam tilt.

A further version of the method in accordance with the invention is characterized in that the reference is formed by a locus in a Fourier space in which the linear image part is concentrated in any absence of the unintentional beam tilt. The linear image parts are concentrated on a locus in the Fourier space. This locus is formed by two spheres which, according to the van Dyck method, are approximated very well by two paraboloids representing the wave function and the complex conjugate of the wave function. Due to unintentional beam tilt, such a paraboloid is displaced over a distance which is proportional to the value of the tilt angle and in the same direction as the beam tilt. Instead of measuring the displacement of the paraboloid itself, it is also possible to measure the displacement of a circle obtained as a section of the paraboloid.

A further version of the method in accordance with the invention is characterized in that a defined beam tilt is induced for the first image. When the unintentional beam tilt is very small, an addition defined beam tilt can be induced, so that the unintentional beam tilt can be more accurately determined from the measurement of the sum of the unintentional and the induced beam tilt.

An alternative version of the method in accordance with the invention is characterized in that each of the images is an electron hologram formed by interference of an electron wave scattered by the object with a reference electron wave. Fourier filtering can then be performed by arranging a filter around the spatial frequencies of the reference electron wave in the spectrum of the hologram. Consequently, the linear image part is directly selected.

A special version of the method is characterized in that in order to derive the defocus value f as an exit plane of an object having a thickness t from a defocus value f' determined by the method and so determined for beam tilt, the corrected defocus value f' is reduced by half the thickness t. Because the effect of beam tilt on the electron scattering in the specimen is taken into account up to the second order, the defocus value to be measured is thereby corrected.

Another special version of the method is characterized in that a spherical aberration constant is calculated from a cross-spectrum of at least two linear image parts. The spherical aberration coefficient can thus be accurately determined. This is because this parameter, being constant in principle, depends strongly on the position of the specimen relative to the objective lens.

BRIEF DESCRIPTION OF THE DRAWING

The invention will be described in detail hereinafter with reference to the drawing.

DETAILED DESCRIPTION OF THE PREFERRED EMBODIMENTS

Figure 1:
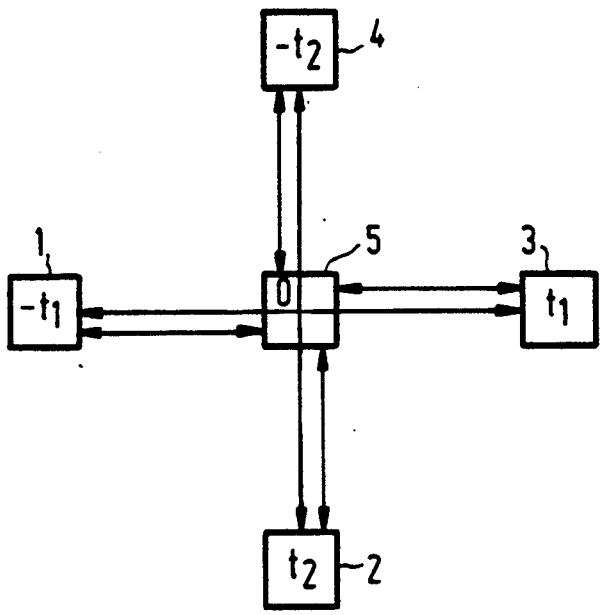
FIG. 1 shows an example of the number of images, with associated beam-tilt, required for determining unintentional beam tilt, defocus and astigmatism.

Autotuning is to be understood to mean herein the measurement and, if necessary correction of parameters such as unintentional beam tilt, defocus, astigmatism and the spherical aberration coefficient, without intervention by the user. This can be realised, for example in a closed circuit consisting of a computer-controlled transmission electron microscope (TEM) and a detection system, coupled to an image processing system.

The method as described in the publication by Koster et al can be used only for linear signals. This means in principle that the Koster method can be performed only in the case of specimens for which the weak pulse object (WPO) approximation holds or in the case of low magnifications. A decisive factor in this respect is the scattering power integrated over the thickness of the specimen. This means that for a crystalline specimen the maximum permissible thickness is very small; for example, the gold (Au), $t_{max}=1$ atomic layer, while for an amorphous material such as carbon (C) $t_{max}$ may be 5 nm. Consequently, autotuning is in principle not possible in the case of thick and/or crystalline specimens, because the WPO approximation in reality rarely holds for crystalline TEM specimens. The underlying problem for such specimens is two-fold:

1) The wave function $\psi_{obj}$ at the exit plane of the object is generally dependent on the beam tilt. Therefore, the effect of the object and the effect of the beam tilt should be separated. Prior knowledge of the object structure will then no longer be necessary.

2) Imaging is no longer linear, notably in the case of crystalline specimens, because the intensity of the scattered beams may be comparable to that of the transmitted beam and could interfere with one another. The described autotuning method provides separation and selection of the linear image part from an image containing linear as well as non-linear information, so that subsequently the method analogous to the Koster method can be applied. An image of an object which is not suitable for the WPO approximation contains linear as well as non-linear image information. The linear image information is the part of the image contrast which is proportional to the wave function $\psi_{obj}$ and will be referred to hereinafter as the linear image part. The linear image part is selected from each image by Fourier filtering in the Fourier space. The method of Fourier filtering is dependent on the method of forming the images to be processed. A first method of forming such images is by holography by means of electron beams, as is known from the publication "Electron Holography Approaching Atomic Resolution" by Lichte in Ultramicroscopy 20 (1986), page 293. An electron beam emitted by an electron microscope may be considered, for example as two sub-beams, one of the sub-beams being scattered by the object. The other non-scattered sub-beam does not "see" the object and reaches the recording medium as a reference electron wave, the electron wave scattered by the object and the reference electron wave interfering with one another and generating a hologram. For selection of the linear image part, subsequently two-dimensional Fourier filtering is applied to the spectrum of the hologram by arranging a filter around the spatial frequencies of the reference electron wave. Another method of forming composite images is the method described by van Dyck et al in Proceedings of the XIIth International Congress for Electron Microscopy, Seattle, August 1990, Vol. I, pp. 26-27. This image reconstruction method in principle consists of recording a series of elementary images with different defocus values, the difference with respect to a reference focus value being known. A quasi-three-dimensional image area is thus recorded.

For autotuning it is merely necessary to measure a number of parameters, which means that in principle the number of elementary images in the defocus series may be less than in the image reconstruction method by van Dyck et al where the complete wave function $\psi_{obj}$ must be determined. The parameters of importance in this respect are beam tilt, defocus, astigmatism and spherical aberration. According to applicant's method, the Fourier filtering for separation and selection of the linear image part is realised by two-dimensional Fourier transformation of the elementary images, after which the spectra thus obtained are multiplied by a number of complex weighting factors which together constitute the filter in the three-dimensional Fourier space. The complex weighting factors contain the relevant beam tilt in which the unintentional as well as the induced beam tilt are comprised. Furthermore, the weighting factors are dependent on the spatial frequency and the focus increment used. More possibilities exist in respect of the determination of unintentional beam tile.

When the images are formed by holography, five images are recorded as shown in FIG. 1: a first image 5 with induced beam tilt and also two pairs (1, 3) and (2, 4) of images with a beam tilt in two different directions $t_1$ and $t_2$, the images involving an opposed beam tilt ($t_1$, $-t_1$) and ($t_2$, $-t_2$) per pair (1, 3) and (2, 4). The relevant parameter can again be determined by measurement and combination of given relative displacements. When the image reconstruction method of van Dyck et al is used to form the images, for the determination of the unintentional beam tilt it suffices to record one focus series without induced beam tilt. The linear image information separated according to this method is present on two spheres, being two paraboloids in the van Dyck approach, in the Fourier space. As a measuring instrument for determining the unintentional beam tilt use can be made of a paraboloid itself as well as of a circle obtained as a section of the paraboloid. In the presence of unintentional beam tilt, the apex of the paraboloid or the centre of such a circle will have been displaced with respect to a reference, in this case being a paraboloid or a circle, in the absence of unintentional beam tilt. The displacement is proportional to the value of the angle of tilt and occurs in the same direction as the beam tilt. When the unintentional beam tilt is small, a defined additional beam tilt can be induced so that the unintentional beam tilt can be more accurately determined by measurement of the sum of the unintentional and the induced beam tilt. When the images are formed by holography, the defocus and astigmatism parameters can be determined via another combination of the same measured displacements.

Figure 2:
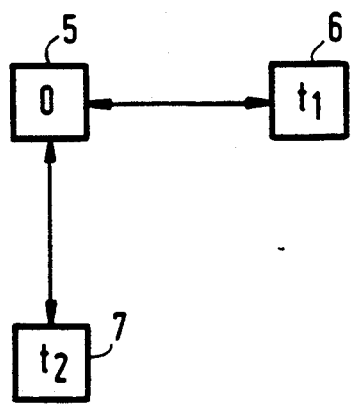
FIG. 2 shows an example of the number of images with associated beam tilt, required for determining defocus and astigmatism with known unintentional beam tilt.

When the unintentional beam tilt is known in advance and/or has been corrected, three images suffice when the images are formed by means of the van Dyck method. This possibility is proposed in FIG. 2. To this end, a first image 5 is recorded without induced beam tilt and at least two further images 6, 7 are recorded with a defined, induced beam tilt, the direction of which differs for each image. The defocus and astigmatism parameters are then determined by measurement and combination of displacements of the linear image parts of the at least three images relative to one another. In given circumstances the defocus and astigmatism parameters can be determined according to the Lichte method without separate determination of the unintentional beam tilt.

Figure 3:
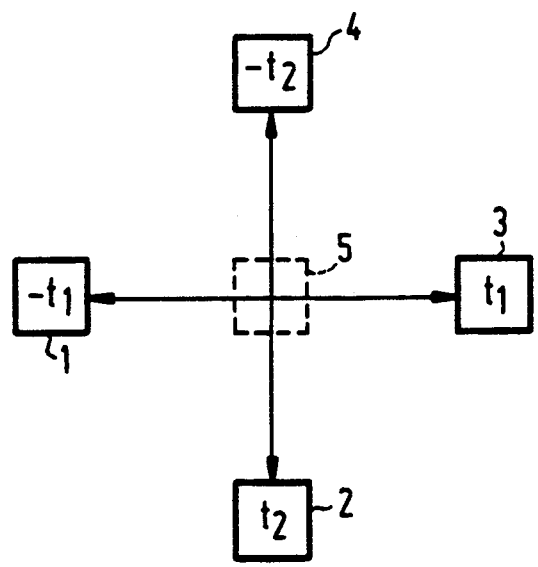
FIG. 3 shows an example of the number of images, with associated beam tilt, required for determining defocus and astigmatism without prior knowledge of the unintentional beam tilt.

When the unintentional beam tilt has not been predetermined, the defocus and astigmatism parameters can be determined as shown in FIG. 3 by measurement and combination of relative displacements of the linear image parts of four images (1, 2, 3, 4) forming two pairs (1, 3), (2, 4) of images with an induced beam tilt in two different directions $t_1$ and $t_2$, the beam tilt for two images of one pair being opposed ($t_1$, $-t_1$) and ($t_2$, $-t_2$). The image 5 without induced beam tilt is not necessary in this case, as indicated by a broken line. The beam tilts of the two pairs (1, 3), (2, 4) of images are shown to be mutually perpendicular. The procedure can be mathematically described as follows. The wave function can be written as:

$$\psi = \phi + \phi_0$$

where $\phi$ is the part containing information of the object and $\phi_0$ is the transmitted beam. For the sake of simplicity, it will be assumed hereinafter that $\phi_0 = 1$. The image can then be represented as $$I = |\psi|^2 = |1+\phi|^2 = 1 + \phi + \phi^* + |\phi|^2.$$

The linear parts $\phi$ and $\phi^*$ are situated on two paraboloids in the Fourier space. The desired parameter is each time determined from the measurement and combination of relative displacements of the linear image parts. This can be realised in a first manner by means of the cross-correlation of two linear image parts which is defined by:

$$C(\vec{R}) = \int I_1(\vec{R}+\vec{R},\theta_1) I_2(\vec{R},\theta_2) d\vec{R}$$

where $I_1$ and $I_2$ are two linear image parts and $\theta_1$ and $\theta_2$ represent a symbolic notation for the adjustable microscope parameters (defocus, astigmatism and beam tilt). This produces a peak which has been displaced with respect to a reference position. A second method contains in determination of the slope of the phase spectrum of the image parts in the Fourier space. The phase spectrum is defined as:

$$P_{12}(\vec{G}) = \arg S_{12}(\vec{G})$$

$$S_{12}(\vec{G}) = I_1(\vec{G},\theta_2) \times I_2(\vec{G},\theta_2)$$

is the cross-spectrum. The displacement is then determined from:

$$\vec{d}_{12}(\vec{G}) \sim -\frac{\partial P_{12}}{\partial \vec{G}}$$

where $I_1$ and $I_2$ are the Fourier transforms of the linear image parts and $\vec{G}$ is the spatial frequency.

It follows from the phase spectrum that the described method produces a corrected defocus value f' which must be reduced by half the thickness t of the object at order to obtain the defocus value in the exit plane of the object. This means that the defocus value is determined relative to the centre of the object. Furthermore, from the cross-spectrum itself the spherical aberration coefficient of the linear image parts of two focus series can be calculated. This coefficient is in principle a constant term. However, in practice this is not the case, because the spherical aberration depends strongly on the position of the specimen relative to the objective lens.

We claim:

1. A method for autotuning an electron microscope wherein an electron beam scans the object to be examined and an image of the object is produced from the electron beam radiation therefrom; said method comprising:
   producing a series of images of said object by inducing a defined tilt of the electron beam in a different direction for each respective image, the beam tilt being relative to a reference alignment of the beam, the beam being subject to possible unintentional tilt from the reference alignment thereof;
   decomposing each image into a linear image component and a non-linear image component, and obtaining the linear image components by separating them from the non-linear image components;
   measuring the displacements of a number of the linear image components relative to each other; and
   combining the measured relative displacements of the linear image components so as to derive autotuning parameters for the electron microscope.

2. A method as claimed in claim 1, wherein the linear image components are separated by Fourier filtering.

3. A method as claimed in claim 1, wherein said series of images includes a first image and at least two further images, and a measure of unintentional beam tilt is determined from the displacement of the linear component of the first image relative to a reference image.

4. A method as claimed in claim 3, wherein the reference image is derived from said further images.

5. A method as claimed in claim 1, wherein each image is a hologram formed by interference between an electron wave scattered by said object and a reference electron wave, the linear component of each image being obtained by separation from the non-linear component thereof in a two-dimensional Fourier space.

6. A method as claimed in claim 1, wherein said object has a thickness t and the processing of the measured relative displacements of the linear image components derives a defocus parameter f', and further comprising deriving a defocus value f at an exit plane of said object by reducing the defocus value f' by half of the thickness t.

7. A method as claimed in claim 1, wherein the processing of the measured relative displacements derives a spherical aberration constant from a cross-spectrum of the measured relative displacements of the linear image components of at least two of said images.

8. A method as claimed in claim 7, wherein the weighting factor for an image takes into account the tilt of the scanning beam for such image.

9. A method as claimed in claim 1, wherein each image is a hologram formed by interference between an electron wave scattered by said object and a reference electron wave, the linear component of each image being obtained by separation from the non-linear component thereof in a two-dimensional Fourier space.

10. A method as claimed in claim 1, wherein said object has a thickness t and the processing of the measured relative displacements of the linear image components derives a defocus parameter f', and further comprising deriving a defocus value f at an exit plane of said object by reducing the defocus value f' by half of the thickness t.

11. A method as claimed in claim 1, wherein the processing of the measured relative displacements derives a spherical aberration constant from a cross-spectrum of the measured relative displacements of the linear image components of at least two of said images.

* * * * *